(12) United States Patent
Wielsma

(10) Patent No.: US 7,113,132 B2
(45) Date of Patent: Sep. 26, 2006

(54) LOW-LOSS PRINTED CIRCUIT BOARD ANTENNA STRUCTURE AND METHOD OF MANUFACTURE THEREOF

(75) Inventor: Jan Wielsma, Culemborg (NL)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/108,326

(22) Filed: Apr. 18, 2005

(65) Prior Publication Data

US 2005/0179600 A1    Aug. 18, 2005

Related U.S. Application Data

(63) Continuation of application No. 10/609,980, filed on Jun. 30, 2003, now Pat. No. 6,940,456, which is a continuation of application No. 10/126,600, filed on Apr. 19, 2002, now Pat. No. 6,759,984.

(60) Provisional application No. 60/295,191, filed on Jun. 1, 2001.

(51) Int. Cl.
    *H01Q 1/38*    (2006.01)
(52) U.S. Cl. .............................. 343/700 MS; 343/846
(58) Field of Classification Search ......... 343/700 MS, 343/846
    See application file for complete search history.

(56) References Cited

U.S. PATENT DOCUMENTS

| | | | |
|---|---|---|---|
| 4,873,529 A | 10/1989 | Gibson | |
| 5,319,378 A | 6/1994 | Nalbandian et al. | |
| 5,828,340 A * | 10/1998 | Johnson | 343/700 MS |
| 5,859,614 A | 1/1999 | Paolella et al. | |
| 6,075,485 A | 6/2000 | Lilly et al. | |
| 6,204,814 B1 | 3/2001 | Rothe | |
| 6,377,227 B1 | 4/2002 | Zhu et al. | |
| 6,424,317 B1 | 7/2002 | Rudish | |
| 6,501,425 B1 * | 12/2002 | Nagumo et al. | 343/700 MS |
| 6,542,050 B1 * | 4/2003 | Arai et al. | 333/134 |
| 6,759,984 B1 | 7/2004 | Wielsma | |
| 6,982,671 B1 * | 1/2006 | Killen et al. | 343/700 MS |
| 6,992,637 B1 * | 1/2006 | Hwang et al. | 343/770 |

OTHER PUBLICATIONS

U.S. Appl. No. 10/609,980 filed on Jun. 30, 2003 entitled "Low-Loss Printed Circuit Board Antenna Structure and Method of Manufacture Thereof" to Jan Wielsma which has been allowed on Jan. 28, 2005.
U.S. Appl. No. 10/675,195 filed on Sep. 30, 2003 entitled "Low-Loss Printed Circuit Board Antenna Structure and Method of Manufacture Thereof" to Jan Wielsma which is currently pending.

* cited by examiner

*Primary Examiner*—Trinh Vo Dinh

(57) ABSTRACT

The present invention provides a method of manufacturing an antenna structure. In one embodiment, the method includes forming an antenna trace on a substrate proximate a ground plane of the substrate. In addition, the method includes creating an insulation region extending through the substrate and located between the antenna trace and the ground plane.

14 Claims, 2 Drawing Sheets

LOW-LOSS PRINTED CIRCUIT BOARD ANTENNA STRUCTURE AND METHOD OF MANUFACTURE THEREOF

CROSS-REFERENCE TO PROVISIONAL APPLICATION

This application is a continuation of U.S. patent application Ser. No. 10/609,980 now U.S. Pat. No. 6,940,456, entitled "LOW-LOSS SUBSTRATE ANTENNA STRUCTURE AND METHOD OF MANUFACTURE THEREOF", to Jan Wielsma and filed on Jun. 30, 2003 which has been allowed, which is a Continuation application Ser. No. 10/126,600 filed Apr. 19, 2002, now of U.S. Pat. No. 6,759,984 which issued on Jul. 6, 2004 to Jan Wielsma. The above-listed application is commonly assigned with the present invention and is incorporated herein by reference as if reproduced herein in its entirety.

TECHNICAL FIELD OF THE INVENTION

The present invention is directed, in general, communication devices and, more specifically, to an antenna structure having a low-loss and high efficiency, and a method of manufacture thereof.

BACKGROUND OF THE INVENTION

Printed circuit boards (PCBs) are the benchmark for mounting electronic circuit components in today's communications hardware. Conventional PCBs include a rigid substrate to provide support for mounting electronic components in communications devices. In addition, conductive materials are plated over such substrates and etched to provide electrically conductive traces for interconnecting these components. For many communication devices, an area or a whole layer of such a PCB is often reserved as a ground plane serving as a reference ground for mounted electronic circuitry. Therefore, PCBs may be manufactured with multiple layers, each interconnected with conductive vias, to further provide electrical connections for complex electronic circuitry.

For many communications devices, antennas are typically formed on the same PCBs, which also carry transmitting and receiving radio frequency (RF) circuitry. A common technique employed to form antennas on PCBs is to simply etch an antenna trace, similar to the traces mentioned above, having an antenna feeder trace coupled to desired components on the PCB. Since space is limited in the ever-decreasing size of today's communications devices, such antenna traces are typically formed near one or more ground planes formed on the same PCB. In such arrangements, a portion of the PCB substrate, typically the area of a PCB having the highest density of electromagnetic energy, remains in between the antenna and the ground plane, leading to antenna efficiency degradation.

More specifically, as radio signals travel along an antenna trace, a portion of the signals are typically "lost" through energy loss or dissipation in the medium around the antenna trace, especially the medium between the antenna trace and the ground plane. The portion of total initial RF signals radiated into the surrounding space determines the antenna transmission efficiency (measured in dB) of the antenna. The same principle applies for antenna reception. Ideally, a 100% (0.0 dB) efficiency would be achieved if all of the RF signals traveling through the antenna were radiated into the surrounding space. However, as may be expected, the material from which a PCB is constructed has a large impact on the percentage of RF signals that are dissipated into PCB material surrounding the antenna structure. So-called "lossy" PCBs, such as the popular FR-4 PCB, are composed of materials (e.g., fiberglass and epoxy) that dissipate a relatively large amount of the signal. However, because lossy PCBs are both inexpensive to manufacture and process, manufacturers are eager to utilize them in an effort to drive down overall manufacturing costs. On the other hand, since RF signal loss becomes more important as transmission frequencies increase, the current trend in communications devices from 2.4 Ghz to 5 GHz technology may severely limit all future use of less expensive lossy PCBs.

Faced with the problem of RF signal dissipation, some manufacturers have chosen to employ low-loss PCBs, manufactured from materials that allow relatively low signal dissipation, in their communications devices. Low-loss substrates such as these usually have a dielectric loss coefficient (tg(d)) of about 0.01 or less. Examples of such substrates are the Rogers 4000 series, the PTFE, and the GTEK, each composed of special mixtures of materials such as fiberglass, epoxy, Teflon, ceramic, etc. Conventional antenna structures having an antenna trace formed on low-loss substrates usually have an antenna efficiency of about −0.5 dB or better, which translates into a radiation efficiency of about 90% or more. The same antenna structure on a lossy PCB, such as FR-4, usually has an antenna efficiency of about −2.0 dB, which translates into a radiation efficiency of about 65%. However, although providing increased antenna efficiency, low-loss PCBs tend to drive up overall product costs.

Another approach to reducing signal dissipation, and thus increasing antenna efficiency, has been to mount antennas above the substrate of the PCB. Those who are skilled in the art understand that air (e.g., an open space) between the antenna and the ground plane provides an optimum medium for antenna efficiency. The presence of almost any material in its place leads to decrease in antenna efficiency. Unfortunately, manufacturing such 3-dimensional antennas on PCBs, even low cost lossy PCBs, typically requires at least some human intervention during the manufacturing process. Of course, human intervention into the manufacturing process typically drives up the overall manufacturing costs of communications devices. In addition, human error that may occur during manufacturing detracts from overall product quality and longevity. Materials beyond the etched plated conductors used for antenna traces may further increase overall costs. Moreover, since such raised antennas are typically held on the substrate by a limited number of points, usually only two, the chance for antenna breakage during product use is increased.

Accordingly, what is needed in the art is an antenna structure, for use with a PCB, that does not suffer the RF signal dissipation experienced on prior art PCBs.

SUMMARY OF THE INVENTION

To address the above-discussed deficiencies of the prior art, the present invention provides an antenna structure. In one embodiment, the antenna structure includes an antenna trace formed on a substrate proximate a ground plane of the substrate. The antenna structure further includes an insulation region extending through the substrate and located between the antenna trace and the ground plane.

In another embodiment, the present invention provides a method of manufacturing an antenna structure. In one embodiment, the method includes forming an antenna trace on a substrate proximate a ground plane of the substrate. In addition, the method includes creating an insulation region extending through the substrate and located between the antenna trace and the ground plane.

In yet another embodiment, the present invention provides a printed circuit board (PCB). In one embodiment, the PCB includes a substrate having a ground plane and conductive traces formed thereon. In addition, the PCB includes an antenna structure having an antenna trace formed on the substrate proximate the ground plane. The antenna structure also includes an insulation region extending through the substrate and located between the antenna trace and the ground plane.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
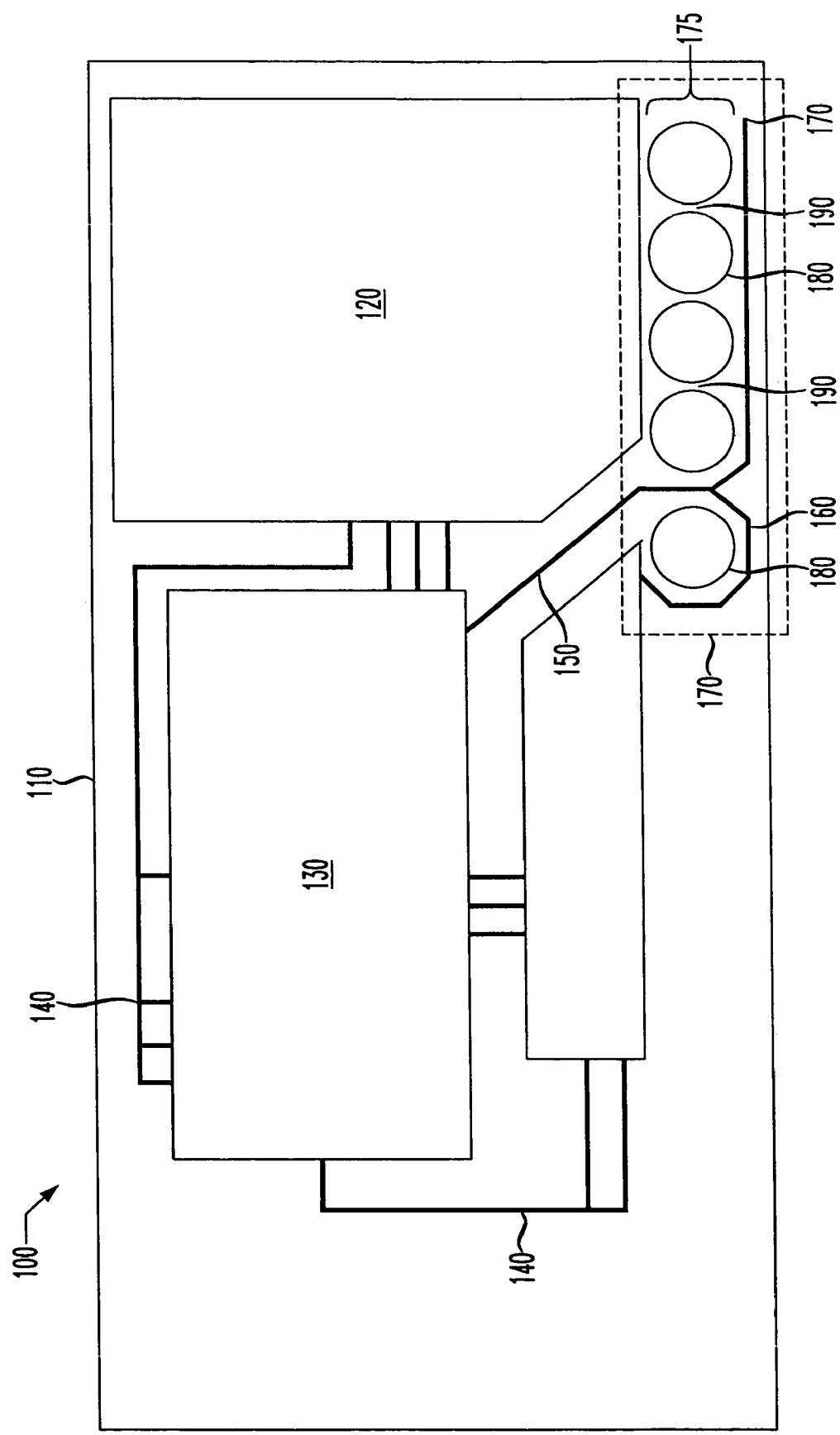
FIG. 1 illustrates one embodiment of a printed circuit board (PCB) having an antenna structure constructed according to the principles of the present invention.

Referring initially to FIG. 1, illustrated is one embodiment of a printed circuit board (PCB) 100 having an antenna structure constructed according to the principles of the present invention. The PCB 100 includes a substrate 110. In accordance with conventional practice, the substrate 110 may be a lossy circuit board, for example, the popular and inexpensive FR-4 board. By employing a relatively high loss board, such as an FR-4 PCB, the overall manufacturing costs of the PCB 100 incorporating the present invention may be kept low. Of course, the present invention may be also employed with a low loss PCB without detracting from the benefits described herein.

Mounted on the substrate 110 is a ground plane 120. As is well known, the ground plane 120 provides an electrical ground connections for electrical circuitry 130 located on the substrate 110 and mounted over the ground plane 120. If the PCB 100 includes multiple layers, as is typically the case, the ground plane 120 may occupy several levels of the PCB 100, with vias interconnecting the several layers. In addition, the circuitry 130 may include vias and conductive traces (not illustrated) to electrically interconnect various components of the circuitry 130 to each other and to the ground plane 120. In an exemplary embodiment, the conductive traces and ground plane 120 are plated copper and are formed on the substrate 110 by etching away unwanted portions of copper plating. Of course, other conductive materials may be used to form conductive traces. In addition, other processes for forming the conductive traces over the substrate 110 may also be employed.

The PCB 100 further includes an antenna feeding line 140. As illustrated, the antenna feeding line 140 is electrically coupled to the circuitry 130 located on the substrate 110. In accordance with conventional practice, the antenna feeding line 140 provides an interconnection between circuitry employing radio frequency (RF) input and output signals and an antenna structure 150. In the illustrated embodiment, the antenna structure 150 includes an antenna trace 160. Both the antenna feeding line 140 and the antenna trace 160 may be formed on the substrate 110 in a manner similar to that used to form conductive traces, however the present invention is not so limited. In addition, the antenna feeding line 140 and the antenna trace 160 may be formed from copper, primarily because of its conductive properties, but the present invention is broad enough to encompass other materials having similar characteristics.

As is commonly found on conventional circuit boards employing RF communications, the antenna trace 160 is formed on the substrate 110 in relatively close proximity to the ground plane 120. As is known, the material comprising the substrate 110 may allow a portion of the RF signals passing through the antenna trace 160 to dissipate in the substrate 110 material, which is the RF signal loss. Circuit boards composed of materials that lose a relatively high portion of RF signals, for example, about 35% of signals, through dissipation in the substrate 110 are known as high loss or "lossy" PCBs. Such lossy PCBs are commonly constructed from a mixture of fiberglass and epoxy, or similar inexpensive materials. Such lossy PCBs typically have a tg(d) of about 0.04 or higher, and thus an antenna efficiency of about −2.0 dB or worse.

In contrast, if the material comprising a PCB only allows a relatively low dissipation of RF signals to the ground plane 120, for example, less than about 15% of signals, then it is usually known as a low-loss PCB. Such low-loss PCBs are commonly constructed from ceramic, Teflon or even special mixtures of fiberglass and epoxy, and typically have a tg(d) of about 0.01 or lower, and thus an antenna efficiency of about −0.5 dB or better. As discussed above, since low-loss PCBs are significantly more costly than lossy PCBs, manufacturers have typically settled for a decreased antenna efficiency in exchange for lower overall manufacturing costs. However, a PCB antenna structure according the principles disclosed herein allows the use of a less expensive lossy board, without suffering from the low antenna efficiency traditionally associated with lossy PCBs.

To the accomplish this, the antenna structure 150 of the present invention includes an insulation region 170 formed between the ground plane 120 and the antenna trace 160. In the illustrated embodiment, the insulation region 170 is shown as a plurality of openings (some of which are designated 180) formed through the substrate 110 and, thus, imposing air as an insulator. However, it must be understood that the present invention is not limited to a plurality of openings 180, and is broad enough to encompass other types of insulation barriers. Other embodiments of the antenna structure 150 may include a solid insulating material inserted between the ground plane 120 and the antenna trace 160 to form the insulation region 170. In such an embodiment, conventional forms of plastic (for example, ABS plastic) may be used as a solid insulating material to create the insulation region 170 of the antenna structure 150. Other embodiments may employ conventional low-loss materials, such as Teflon or ceramic, as an insulating material in the insulating region.

In the illustrated embodiment, when the insulation region 170 is formed with openings 180, all or a substantial portion of the substrate 110 originally located between the ground plane 120 and the antenna trace 160 is removed. Since all or a substantial portion of the substrate 110 from this location is removed (or replaced if an insulating material is used), there remains far less material of the lossy substrate 110 through which RF signals may dissipate through to the ground plane 120. Therefore, the decrease in RF signal loss results in an increased antenna transmission and reception efficiency. In those embodiments where an insulating material is used to create the insulation region 170, the RF dissipation properties of the material would determine the antenna efficiency.

In another embodiment, the insulation region 170 is created by a single opening 180 formed between the ground plane 120 and the antenna trace 160, removing all of the substrate 110 material from that location. In such an embodiment, a portion of material may be left at opposing ends of the antenna trace 160 to provide at least minimal structural support for the portion of the substrate 110 on which the antenna trace 160 is formed. Additionally, the opening 180 may be made as large as the area of the substrate 110 between the antenna trace 160 and the ground plane 120, and extend to the edges of each. By creating the opening 180 as large as possible, less amount of substrate 110 material remains in the area of high concentration of RF energy, thus avoiding the dissipation of RF signals into the substrate 110.

In an advantageous embodiment, multiple openings 180 form the insulation region 170 by drilling holes through the substrate 110. In this embodiment, illustrated in FIG. 1, "bridges" (some of which are designated 190) are left between the ground plane 120 and the antenna trace 160. As a result, a substantial portion of the substrate 110 material between the ground plane 120 and the antenna trace 160 is removed, preventing a significant amount of RF signal dissipation in the substrate 110. Advantageously, however, structural support is still provided by the bridges 190. More specifically, by leaving bridges 190 between the ground plane 120 and the antenna trace 160 a strong structure remains between the portion of the substrate 110 on which the antenna trace 160 is formed and the remaining portions of the substrate 110 on which the ground plane 120 is formed. As before, the multiple openings 180 may also be made as large as the area between the antenna trace 160 and the ground plane 120, extending the length of each, taking into account the desired size of the bridges 190.

Figure 2:
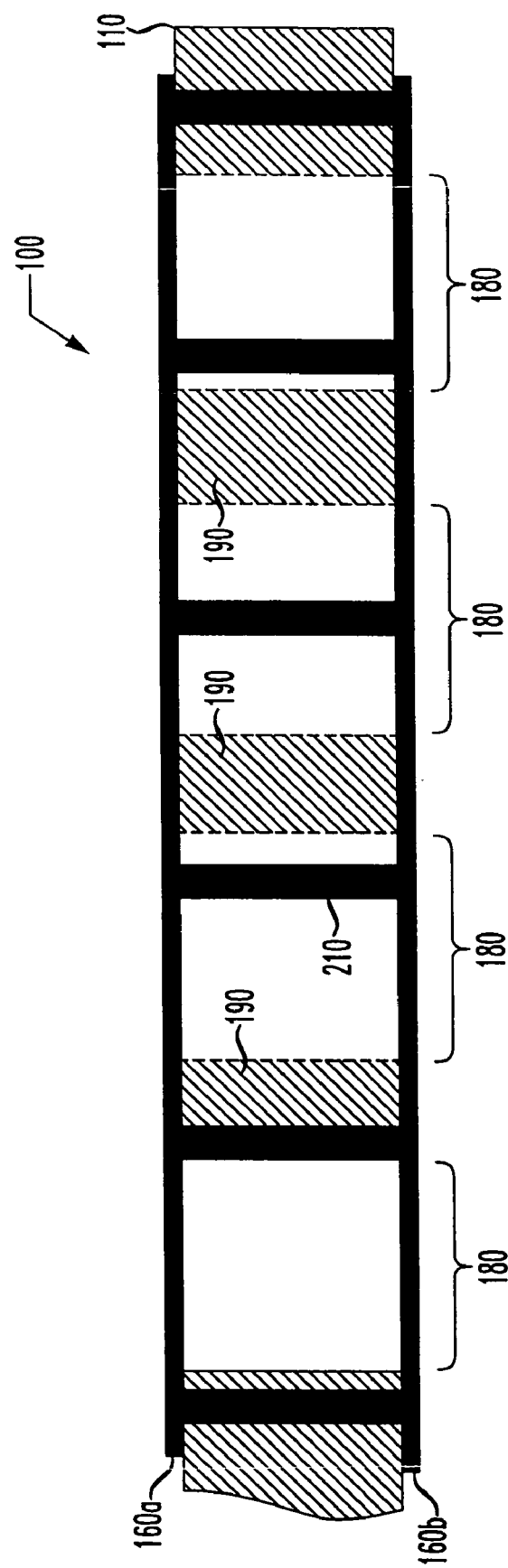
FIG. 2 illustrates a section side view of a portion of the PCB and antenna structure illustrated in FIG. 1.

Turning now to FIG. 2, illustrated is a section side view of a portion of the PCB 100 illustrated in FIG. 1. As illustrated, the PCB 100 still includes the substrate 110 and the insulation region 170 created by the plurality of openings 180 formed therethrough. In addition, first and second antenna traces 160a, 160b are shown formed on opposing faces of the PCB 100. Advantageously, the multiple antenna traces 160a, 160b may be employed where electrical circuitry is mounted on both faces of the PCB 100. Also, multiple antenna traces 160a, 160b may be employed to advantage where the PCB 100 includes multiple layers, having numerous electrically interconnections therethrough.

Connecting the antenna traces 160a, 160b are a plurality of vias 210. The vias 210 may be formed between the first and second antenna traces 160a, 160b to electrically interconnect them. In an exemplary embodiment, the vias 210 are formed from the same material as the antenna traces 160a, 160b, however other conductive materials may also be employed. Although not necessary to practice the present invention, multiple antenna traces 160a, 160b interconnected with conductive vias 210 provide further enhancement of RF signal transmission and reception, as those who are skilled in the art will understand.

By providing a PCB that includes openings between an antenna trace and a ground plane, thus removing a substantial portion of the material between the two, the present invention provides several benefits over the prior art. For instance, the present invention provides for increased antenna efficiency. As discussed in detail above, a lossy substrate (for example, an FR-4 PCB) typically has an antenna efficiency of about −2.0 dB, which translates into about 65% radiation efficiency. Forming openings between the antenna trace and the ground plate, thus substantially removing the substrate material therebetween in accordance with the principles disclosed herein, can increase antenna radiation efficiency to about 90%, with an antenna efficiency approaching about −0.5 dB or better. Those skilled in the art will understand the dramatic increase in antenna efficiency when employing the principles of the present invention, even when using a lossy substrate. Furthermore, those skilled in the art will understand the further increases in antenna efficiency that may be achieved by incorporating the present invention into a low-loss substrate.

In addition, the present invention provides benefits over conventional air antennas mounted over a substrate. For instance, conventional air antennas typically require some human intervention during the manufacturing process in order to properly mount the antennas above the substrate. Since an antenna trace according to the present invention is still simply etched on the substrate, preferably along with other conductive traces and which is typically an automated process, manufacturing costs may be substantially reduced while obtaining a significant increase in antenna efficiency. Moreover, since the present invention provides for an antenna trace etched on the substrate, the fragile structure, often present with air antennas that are suspended above a substrate from only a minimal number of points, is eliminated.

Forming openings as the insulation region in an antenna structure according to the present invention is also relatively simple to incorporate into conventional circuit board manufacturing processes. More specifically, PCBs typically have numerous apertures formed therein early in their manufacture. These apertures may later be used for mounting the PCB within a larger assembly, for receiving bond pads of integrated circuit chips, or even for holding the PCB in certain positions during latter stages of manufacture. In any event, incorporating the formation of a few more openings early in the PCB manufacturing process would be extremely simple. As a result, constructing a PCB incorporating the present invention would have minimal, if any, impact on the time or cost of manufacturing a PCB. Furthermore, this minimal impact to the manufacturing process is the same whether a single opening is formed between the antenna trace and the ground plane, or whether a plurality of openings (leaving support bridges between the two) are formed in the substrate.

Although the present invention has been described in detail, those skilled in the art should understand that they can make various changes, substitutions and alterations herein without departing from the spirit and scope of the invention in its broadest form.

What is claimed is:

1. An antenna structure, comprising:
   an antenna substrate having a planar surface, said antenna substrate having a predetermined radio frequency loss associated therewith;
   a planar antenna trace formed on said planar surface and extending along and adjacent an edge of said planar surface;
   a ground plane formed on said antenna substrate, wherein said ground plane is non-overlapping with said planar antenna trace; and
   a low-loss region located between said planar antenna trace and said ground plane, said low-loss region having a longitudinal axis extending along only a portion of and adjacent said edge, and having a radio frequency loss less than said predetermined radio frequency loss.

2. The antenna structure recited in claim 1, wherein said low-loss region is non-overlapping with said planar antenna trace.

3. The antenna structure recited in claim 2, wherein said ground plane is a planar ground plane and is located on said planar surface and is co-planar with said planar antenna trace.

4. The antenna structure recited in claim 1 further including a plurality of said low-loss regions, wherein each of said low-loss regions is separated by a portion of said substrate and each of said plurality is non-overlapping with said planar antenna trace.

5. The antenna structure recited in claim 1 wherein said low-loss region is selected from a group consisting of:
   ABS plastic;
   air;
   ceramic; and
   Teflon.

6. The antenna structure recited in claim 1 wherein said planar antenna trace comprises a first portion that extends in one direction along said edge and a second portion that extends in an opposite direction along said edge.

7. The antenna structure recited in claim 1 wherein said low-loss region is an opening that extends through a thickness of said substrate.

8. A method of manufacturing an antenna structure, comprising:
   providing an antenna substrate having a planar surface, said antenna substrate having a predetermined radio frequency loss associated therewith
   forming a planar antenna trace on said planar surface along and adjacent an edge of said planar surface,
   placing a ground plane on said antenna substrate, wherein said ground plane is non-overlapping with said planar antenna trace; and
   creating a low-loss region between said planar antenna trace and said ground plane, said low-loss region having a longitudinal axis extending along only a portion of and adjacent said edge, said low-loss region having a radio frequency loss less than said predetermined radio frequency loss.

9. The method recited in claim 8, wherein said low-loss region is non-overlapping with said planar antenna trace.

10. The method recited in claim 8, wherein said ground plane is a planar ground plane formed on said planar surface and co-planar with said planar antenna trace.

11. The method recited in claim 8 wherein said creating includes creating a plurality of low-loss regions, wherein each of said low-loss regions is separated by a portion of said substrate and each of said plurality is non-overlapping with said planar antenna trace.

12. The method recited in claim 8 wherein said creating includes creating a low-loss region selected from a group consisting of:
   ABS plastic;
   air;
   ceramic; and
   Teflon.

13. The method recited in claim 8 wherein said forming includes forming first and second portions of said planar antenna trace wherein said first portion extends in one direction along said edge and the second portion extends in an opposite direction along said edge.

14. The method recited in claim 8 wherein said creating said low-loss region comprises forming an opening that extends through a thickness of said substrate.

* * * * *